United States Patent
Park et al.

[11] Patent Number: 5,837,593
[45] Date of Patent: Nov. 17, 1998

[54] METHODS OF FABRICATING MICROELECTRONIC CAPACITORS HAVING TANTALUM PENTOXIDE DIELECTRICS

[75] Inventors: In-sung Park, Seoul; Eui-song Kim, Kyungki-do, both of Rep. of Korea

[73] Assignee: Samsung Electronics Co., Ltd., Suwon, Rep. of Korea

[21] Appl. No.: 707,298

[22] Filed: Sep. 3, 1996

[30] Foreign Application Priority Data

Sep. 1, 1995 [KR] Rep. of Korea ............ 95-28572

[51] Int. Cl.$^6$ .................. H01L 21/20; H01L 21/8242
[52] U.S. Cl. .................. 438/396; 438/240; 438/253
[58] Field of Search .................. 257/310; 438/3, 438/240, 253, 386, 393, 396, 785

[56] References Cited

U.S. PATENT DOCUMENTS

| | | | |
|---|---|---|---|
| 5,111,355 | 5/1992 | Anand et al. | 257/296 |
| 5,254,505 | 10/1993 | Kamiyama | 438/785 |
| 5,661,319 | 8/1997 | Fujii et al. | 257/310 |
| 5,688,724 | 11/1997 | Yoon et al. | 148/DIG. 14 |

OTHER PUBLICATIONS

Shinriki et al., UV–$O_2$: Two–Step Annealed Chemical Vapor–Deposited $Ta_2O_5$ Films for Storage Dielectrics of 64–Mb DRAM's, IEEE Transactions on Electron Devices, vol. 38, No. 3, Mar. 1991, pp. 455–462.

Primary Examiner—Chandra Chaudhari
Assistant Examiner—Toniae M. Thomas
Attorney, Agent, or Firm—Myers Bigel Sibley & Sajovec

[57] ABSTRACT

A microelectronic capacitor is formed by forming a first tantalum pentoxide film on a conductive electrode and annealing the first tantalum pentoxide film in the presence of ultraviolet radiation and ozone. The forming step and annealing step are then repeated at least once to form at least a second tantalum pentoxide film which has been annealed in the presence of ultraviolet radiation, on the first tantalum pentoxide film. A second conductive electrode may then be formed on the tantalum pentoxide layer. The resultant tantalum pentoxide layer can have a thickness which exceeds 45 Å, yet has a reduced leakage current by filling the oxygen vacancies across the thickness thereof.

14 Claims, 6 Drawing Sheets

METHODS OF FABRICATING MICROELECTRONIC CAPACITORS HAVING TANTALUM PENTOXIDE DIELECTRICS

FIELD OF THE INVENTION

This invention relates to microelectronic manufacturing methods and related structures, and more particularly to manufacturing methods for microelectronic capacitors and related structures.

BACKGROUND OF THE INVENTION

Microelectronic capacitors are becoming increasingly important in microelectronic devices. For example, microelectronic capacitors are widely used in integrated circuit memory devices, such as dynamic random access memory (DRAM) devices. Moreover, as the integration density of memory devices continues to increase, memory devices having larger per-unit area capacitance are often needed to compensate for the reduced capacitance size. Thus, much research has been performed to obtain larger capacitance in submicron devices.

As is well known to those having skill in the art, a capacitor includes a pair of spaced-apart conductive electrodes with a dielectric therebetween. Thus, efforts in obtaining larger capacitance in microelectronic capacitors have generally concentrated on three aspects: reduction of the dielectric thickness, increasing the effective area of the capacitor, and using dielectric material having a high dielectric constant.

Unfortunately, a reduction in the dielectric thickness may be limited by the physical nature of the dielectric material. In particular, although the capacitance generally increases as the thickness of the dielectric is reduced, reduction in thickness beyond a certain limit generally raises the leakage current due to dielectric breakdown. Accordingly, there is generally a limit on how thin the dielectric can be made.

Efforts have also been made to increase the effective area of the capacitor by forming three-dimensional capacitor structures, such as trench, stack or cylinder-type capacitors or combinations thereof. Unfortunately, these three-dimensional geometrical structures tend to complicate the manufacturing process.

In view of the above, efforts have also concentrated in increasing the dielectric constant of the dielectric. A dielectric having a high dielectric constant may provide sufficient capacitance without requiring a complicated capacitor structure or endangering dielectric breakdown of the dielectric.

Many materials have been investigated for their high dielectric constant. For example, tantalum pentoxide ($Ta_2O_5$), titanium strontium trioxide ($SrTiO_3$) and titanium strontium barium trioxide (($BaSr)TiO_3$) have all been investigated. Although titanium strontium trioxide and titanium strontium barium trioxide may have a dielectric constant as high as about 300–600, it has been found difficult to control the composition thereof and to bond these dielectrics to other materials. Thus, they are not widely used.

On the other hand, tantalum pentoxide has been widely used, but has produced problems of unacceptably large leakage current in thin films thereof.

Figure 1A:
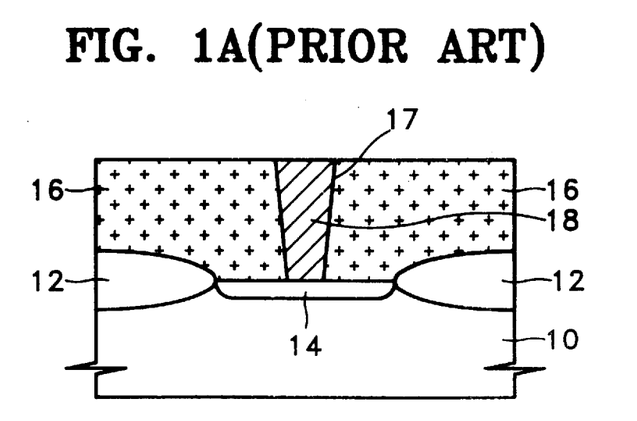
FIGS. 1A–1D are cross-sectional views illustrating a conventional microelectronic capacitor during intermediate fabrication steps.
Figure 1B:
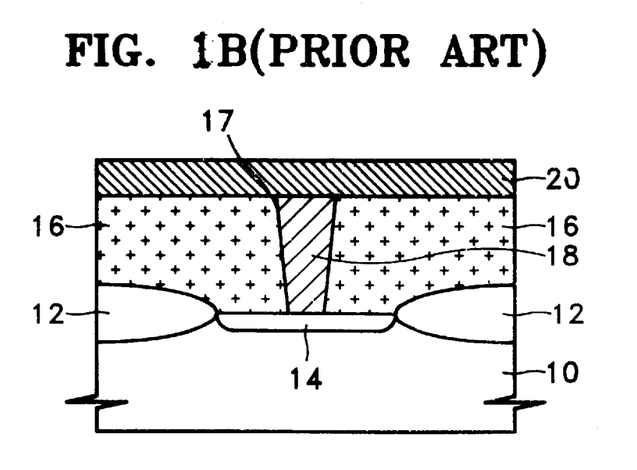
Figure 1C:
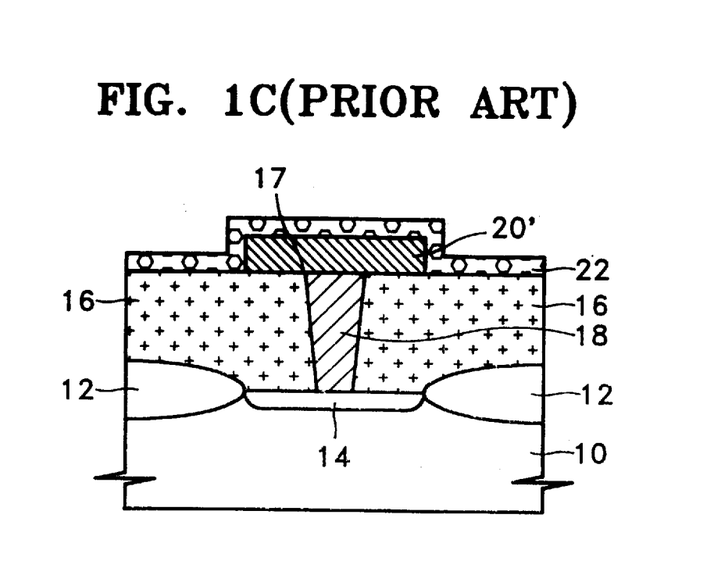
Figure 1D:
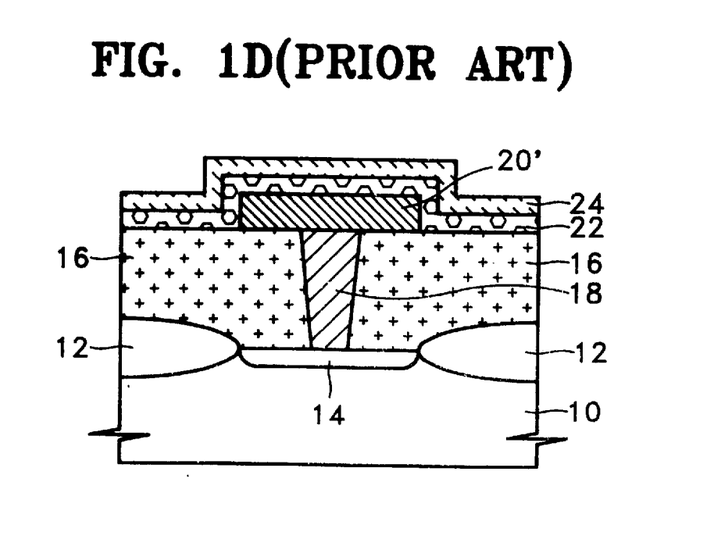

FIGS. 1A–1D are cross-sectional views illustrating a conventional microelectronic capacitor including a tantalum pentoxide dielectric, during intermediate fabrication steps. The completed microelectronic capacitor is shown in FIG. 1D. As shown in FIG. 1D, the capacitor is formed on a semiconductor substrate 10. Field oxide films 12 may be included. A source area 14 to which the capacitor is connected, may also be included. An insulating layer 16 separates the capacitor from the semiconductor substrate 10. A conductive plug 18 connects the capacitor to the source area 14.

The capacitor itself is formed of a conductive layer 20', a tantalum pentoxide film 22 thereon, and a second conductive electrode 24 thereon. When the capacitor is used in an integrated circuit memory device, the first conductive electrode 20' is often referred to as a storage electrode and the second conductive electrode 24 is often referred to as a plate electrode.

Referring again to FIGS. 1A–1D, a method for fabricating a conventional integrated circuit capacitor will now be described. As shown in FIG. 1A, a field oxide film 12 and a source area 14 are formed in a silicon substrate 10. Insulating material 16 is deposited on the substrate 10. A contact hole 17 is patterned in the insulating layer 16 to expose the source area 14. A conductive plug 18 is then formed in the hole 17, for example by depositing impurity doped polysilicon and then etching the impurity doped silicon layer from the surface of the insulating layer 16, so that the conductive plug 18 remains.

Referring now to FIG. 1B, a first conductive layer 20 is formed on the semiconductor substrate 10 over the conductive plug 18. The first conductive layer may be formed of impurity doped polysilicon, WN, TiN, Pt, WSi or combinations of these and/or other materials.

Then, referring to FIG. 1C, a storage electrode 20' is formed by patterning the conductive layer 20 using photolithography or other known processes, so as to expose a portion of insulating layer 16. A tantalum pentoxide film 22 is then formed over the semiconductor substrate 10. The tantalum pentoxide film 22 is preferably formed using pentaethoxy-tantalum, $Ta(OC_2H_5)_5$, as a raw material using sputtering, chemical vapor deposition, liquid source chemical vapor deposition, photo chemical vapor deposition, sol-gel methods or other conventional techniques.

Finally, as shown in FIG. 1D, a plate electrode 24 is formed on the tantalum pentoxide film. The plate electrode 24 may be formed of impurity doped polysilicon, WN, TiN, Pt, WSi or combinations of these and/or other materials.

Unfortunately, it has been found that in the dielectric film formed of tantalum pentoxide as described above, leakage current may be generated due to oxygen vacancies inside the tantalum pentoxide. In particular, when a capacitor having a tantalum pentoxide dielectric is heat treated in subsequent steps, oxygen atoms included in the dielectric film may be activated by the heat energy which is applied to the capacitor. The activated oxygen atoms tend to migrate into the electrode materials of the capacitor. Leakage currents are thereby produced. In other words, when the oxygen atoms become activated in the tantalum pentoxide thin film, oxygen vacancies occur which generate a leakage current.

It is known to reduce leakage current of the tantalum pentoxide thin film by annealing on the tantalum pentoxide film. An annealing method is described in a publication by Shinriki et al. entitled "*UV-$O_3$ DRY-$O_3$: Two-Step Annealed Chemical Vapor Deposited $Ta_2O_5$ Films for Storage Dielectrics of 64-Mb DRAM's*", IEEE, Vol. 38, No. 3, March 1991, pp. 455–462, the disclosure of which is hereby incorporated herein by reference.

The above-described two-step method first exposes the tantalum pentoxide to ultraviolet radiation and ozone. Then, the tantalum pentoxide is exposed to a dry oxygen treatment. The ultraviolet-ozone annealing treatment cures defects such as the oxygen vacancies. That is, the excited oxygen atoms which are generated from decomposition of ozone ($O_3$) by ultraviolet rays (UV) are absorbed through the surface of the tantalum pentoxide film and diffused into the film, thereby filling the oxygen vacancies. The dry-oxygen annealing treatment cures defects, which are referred to as "weak spots", and reduces the density of carbon which is generated during the thermal decomposition of penta-ethoxy-tantalum which is used as the raw material for forming the tantalum pentoxide film.

Unfortunately, it has been found that the UV-$O_3$ annealing treatment described in the above-cited publication has only a limited effect in minimizing the leakage current of the tantalum pentoxide film. In particular, as the thickness of the tantalum pentoxide film increases, the UV-$O_3$ annealing treatment may become increasingly ineffective in filling oxygen vacancies. Accordingly, methods of forming high quality tantalum pentoxide films with reduced oxygen vacancies, are desirable.

SUMMARY OF THE INVENTION

It is therefore an object of the present invention to provide improved methods of fabricating microelectronic capacitors and related structures.

It is yet another object of the present invention to provide improved methods of fabricating microelectronic capacitors having tantalum pentoxide dielectrics and related structures.

It is still another object of the present invention to provide methods of fabricating microelectronic capacitors having relatively thick layers of tantalum pentoxide dielectric without incurring undue leakage current penalties, and related structures.

These and other objects are provided, according to the present invention, by repeatedly forming and annealing tantalum pentoxide films in the presence of ultraviolet radiation and ozone, to build up a tantalum pentoxide layer. By repeatedly forming and annealing tantalum pentoxide films, oxide deficiencies throughout the entire thickness of the film can be filled because the oxygen atoms need only migrate through each layer as it is formed. Accordingly, by reducing oxygen vacancies, leakage current may also be reduced.

In particular, a microelectronic capacitor is formed, according to the present invention, by forming a first tantalum pentoxide film on a conductive electrode on a microelectronic substrate. The first tantalum pentoxide film is annealed in the presence of ultraviolet radiation and ozone. The forming and annealing steps are then repeated at least once to form at least a second tantalum pentoxide film which has been annealed in the presence of ultraviolet radiation, on the first tantalum pentoxide film. A second conductive electrode may then be formed on the at least a second tantalum pentoxide film.

Preferably, the annealing step is performed at temperatures of between about 200° C. and about 400° C., for times of between about one minute and about sixty minutes. Tantalum pentoxide films are repeatedly formed and annealed to form a tantalum pentoxide layer of total thickness between about 10 Å and about 500 Å and preferably greater than 85 Å.

Following formation and annealing of a final tantalum pentoxide film, the entire tantalum pentoxide layer may be annealed in dry oxygen at temperatures of between about 600° C. and about 800° C. for times between about ten minutes and about sixty minutes, in order to reduce weak spots by reducing the density of carbon which is generated during the thermal decomposition of penta-ethoxy-tantalum. It will also be understood that methods according to the present invention may be used to form tantalum pentoxide layers for other applications.

A microelectronic capacitor according to the present invention includes a first conductive electrode on a microelectronic substrate and a tantalum pentoxide layer on the first conductive electrode. The tantalum pentoxide layer has a thickness which exceeds 85 Å and includes filled oxygen vacancies across the thickness thereof. Preferably, the tantalum pentoxide layer includes a plurality of ozone-ultraviolet annealed tantalum pentoxide thin films, each of which includes filled oxygen vacancies. A second conductive electrode is included on the tantalum pentoxide layer. Accordingly, microelectronic capacitors with low leakage currents may be formed.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2A:
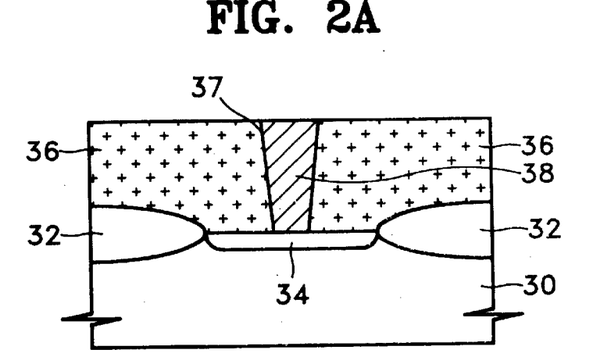
FIGS. 2A–2E are cross-sectional views of a microelectronic capacitor according to the present invention during intermediate fabrication steps.
Figure 2B:
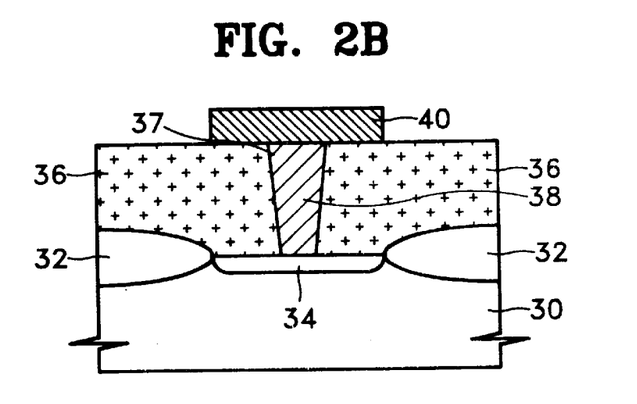
Figure 2C:
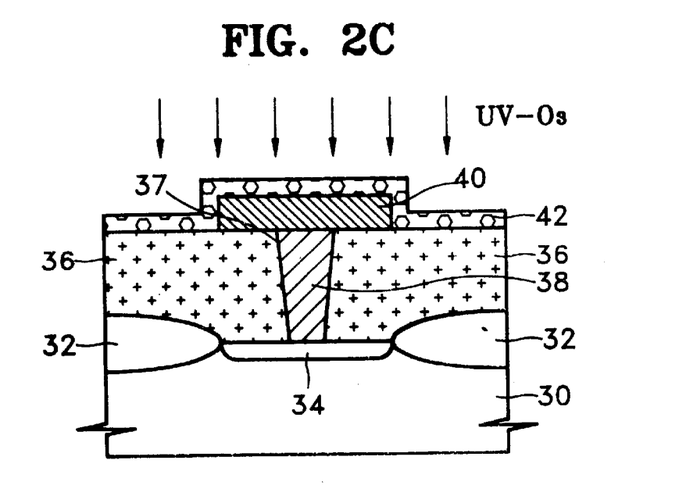
Figure 2D:
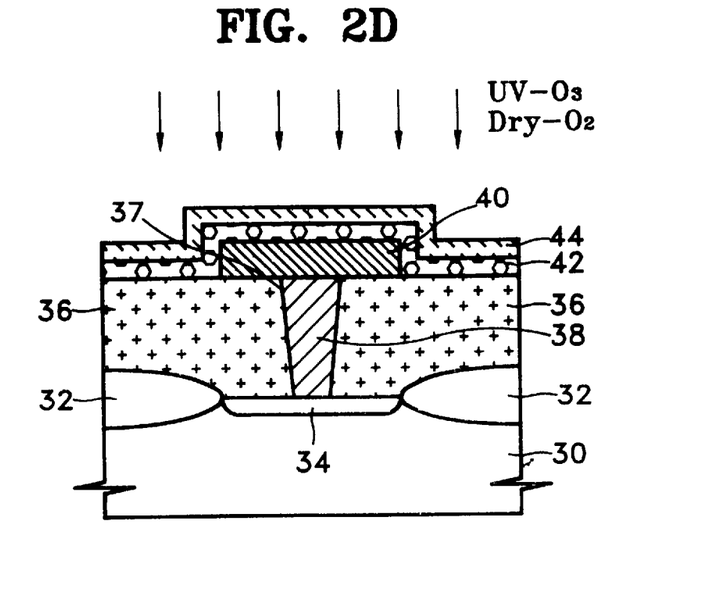
Figure 2E:
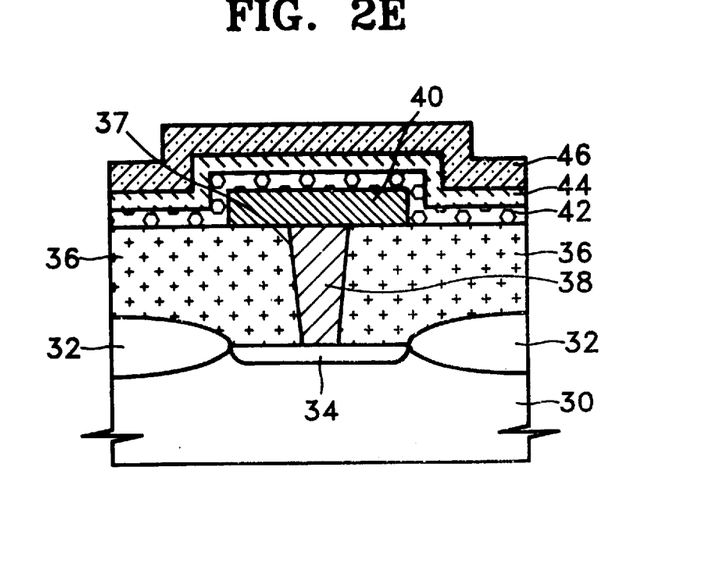

Referring to FIGS. 2A–2E, a microelectronic capacitor according to the present invention is illustrated during intermediate fabrication steps. The completed microelectronic capacitor is illustrated in FIG. 2E. As shown in FIG. 2E, a microelectronic capacitor may be formed on a semiconductor substrate 30 which includes field oxide films 32, a source region 34, an insulating layer 36 having a contact hole 37 therein, and a conductive plug 38 in the contact hole 37. The microelectronic capacitor includes a first storage electrode 40 and a second plate electrode 46. Between the first and second electrodes 40 and 46, is a first tantalum pentoxide film 42 and a second tantalum pentoxide film 44 which together form a tantalum pentoxide dielectric layer. It will be understood that more than two tantalum pentoxide films may be included.

Referring now to FIG. 2A, a method of forming a microelectronic capacitor will be described. In FIG. 2A, an insulating material 36 is deposited on a silicon substrate 30 after field oxide films 32 and a source area 34 is formed therein. A contact hole 37 is formed by etching the insulating layer 36 to expose the source area 34. A conductive material is then formed in the structure to fill the hole 37. The conductive material is then etched from the insulating material 36 to form the contact plug 38. The contact plug 38 may be formed of doped polysilicon or other conventional materials.

Referring now to FIG. 2B, a conductive layer is formed on the surface of the semiconductor substrate and a first (storage) electrode 40 is formed by etching the conductive layer using photolithography or other known techniques. The conductive electrode 40 may be formed of impurity doped polysilicon, WN, TiN, Pt, WSi or combinations of these and/or other materials. The conductive layer may be formed using metal organic chemical vapor deposition, plasma-enhanced chemical vapor deposition, low-pressure chemical vapor deposition or many other conventional microelectronic techniques.

Referring now to FIG. 2C, a first tantalum pentoxide film 42 is formed on the semiconductor substrate including the first (storage) electrode 40. The first tantalum pentoxide film 42 is formed to a thickness of 40 Å using penta-ethoxy-tantalum as a raw material. Conventional methods such as sputtering, chemical vapor deposition, liquid source chemical vapor deposition, photo chemical vapor deposition, sol-gel methods or other conventional techniques may be used.

Then, as shown in FIG. 2C, an annealing process using ozone ($O_3$) and ultraviolet rays (UV), also referred to herein as UV-$O_3$ annealing, is performed on the first tantalum pentoxide film 42. UV-$O_3$ annealing is performed for about fifteen minutes using 0.9 Volt $O_3$ at a temperature of about 300° C. However, a range of temperatures of between about 200° C. and about 400° C. and a range of times of between about one minute and about sixty minutes may be used.

Referring now to FIG. 2D, the steps of FIG. 2C are again performed, to form a second tantalum pentoxide film 44 on the first tantalum pentoxide film 42. Accordingly, the film is formed and then a UV-$O_3$ anneal is performed. Then, as shown in FIG. 2D, a dry-$O_2$ anneal is performed over the semiconductor substrate for about thirty minutes at a temperature of about 800° C. A range of temperatures between about 600° C. and about 800° C., and times of about ten minutes and about sixty minutes may be used. The second tantalum pentoxide film 44 is preferably 45 Å thick, so that the thickness of the entire tantalum pentoxide layer is about 85 Å. It will be understood that one or more additional tantalum pentoxide films may be formed on film 44 to build up the requisite thickness of the tantalum pentoxide layer.

In order to prevent leakage current, it is preferable for the thickness of the entire tantalum pentoxide layer to be over 50 Å. However, when the thickness of the tantalum pentoxide layer extends beyond 1000 Å, the capacitance is generally reduced. Accordingly, it is preferred that the sum of the first and at least second tantalum pentoxide films 42 and 44 is 50–1000 Å. More, preferably, the tantalum pentoxide film in the tantalum pentoxide film forming step has a thickness of 10 Å to about 500 Å.

It will also be understood that by performing the dry oxygen anneal on the tantalum pentoxide layer which comprises the first and at least second tantalum pentoxide films 42 and 44, the density of carbon which is generated from the thermal decomposition of penta-ethoxy-tantalum may be reduced.

Finally, referring to FIG. 2E, a second (plate) electrode 46 is formed on the dielectric film 44. The second (plate) electrode 46 may be formed of impurity doped polysilicon, WN, TiN, Pt, WSi or combinations of these and/or other materials.

Figure 3:
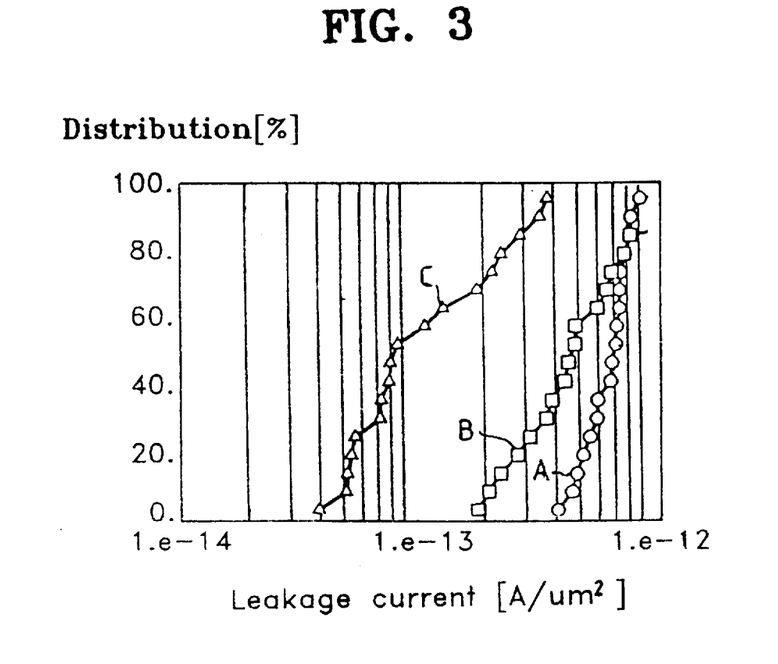
FIG. 3 graphically illustrates the distribution of leakage current density as a function of annealing times and dielectric film thickness.
Figure 4:
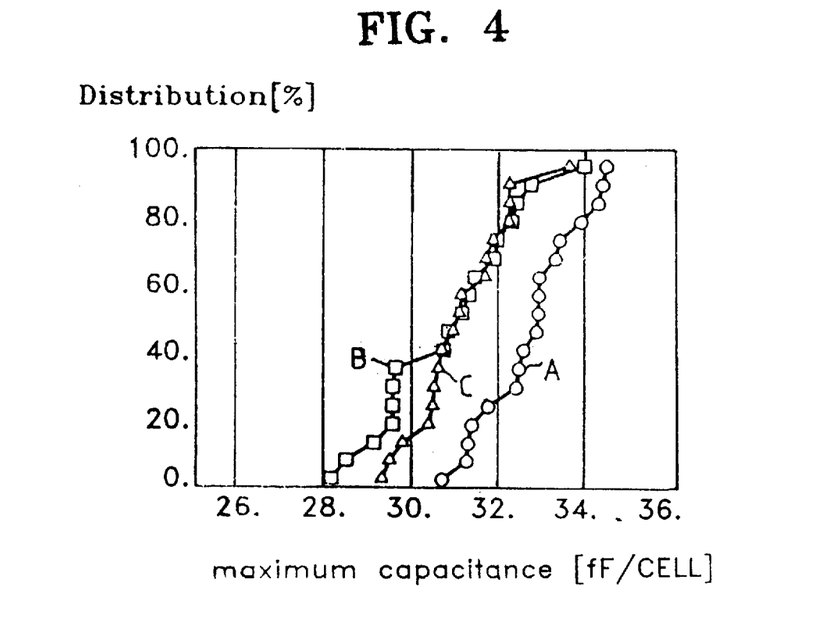
FIG. 4 graphically illustrates the distribution of the maximum capacitance as a function of annealing time and dielectric film thickness.
Figure 5:
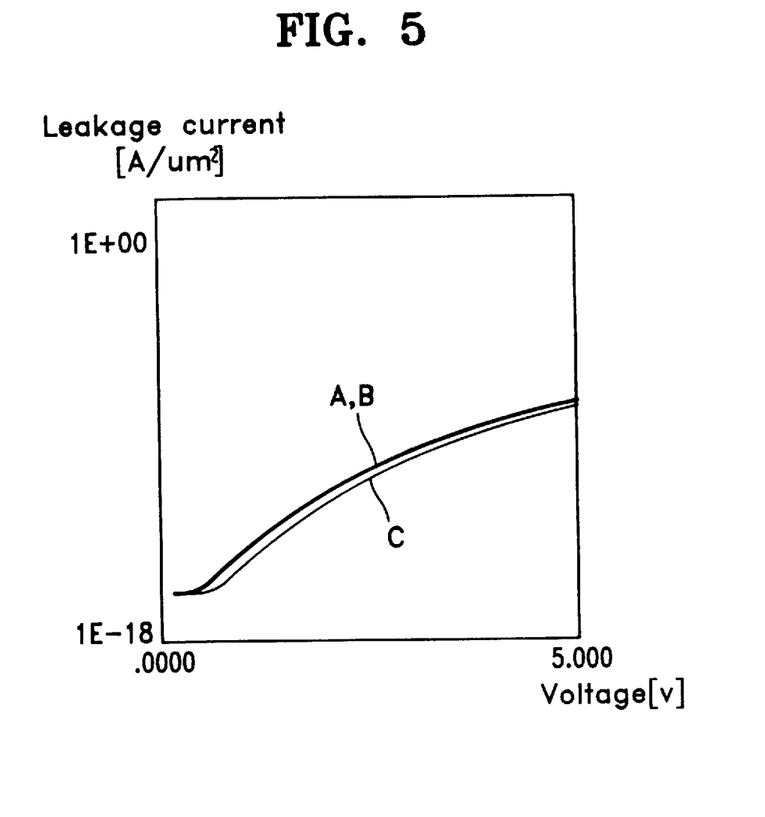
FIG. 5 graphically illustrates distribution of leakage current density as a function of applied voltage.

FIGS. 3–5 graphically illustrate the effect of the present invention. For FIGS. 3–5, $Ta_2O_5$ was deposited to a thickness of 85 Å, as indicated by "A" in FIGS. 3, 4 and 5. Then, after deposition of $Ta_2O_5$ to a thickness of 85 Å, the UV-$O_3$ anneal is performed, as indicated by "B" in FIGS. 3, 4 and 5. Thus "B" indicates a conventional tantalum pentoxide film.

In contrast, "C" in FIGS. 3, 4 and 5 indicates a method in which a tantalum pentoxide film is deposited to a thickness of 45 Å and a UV-$O_3$ anneal is performed. Then a second film of tantalum pentoxide is deposited to a thickness of 40 Å, followed by a UV-$O_3$ anneal. Thus, B and C both indicate tantalum pentoxide layers having 85 Å thickness, where B is formed using a single tantalum pentoxide film and C is formed using first and second tantalum pentoxide films 42 and 44 respectively, according to the present invention.

As shown in FIG. 3, the distribution of leakage current density measured at 1.5V is shown. The X-axis indicates the leakage current density and the Y-axis indicates the distribution thereof. As shown in FIG. 3, there is less leakage current in C compared to A and B. Accordingly, the present invention can reduce leakage current.

In FIG. 4, the maximum capacitance distribution for applied voltages of between −1.5V and 1.5V are shown. The X-axis indicates the maximum capacitance value per unit cell and the Y-axis indicates the distribution of the maximum capacitance. As shown, the maximum capacitance values per unit cell are similar in B and C. Accordingly, a decrease in capacitance is not shown when the present invention is used.

Finally, in FIG. 5, leakage current density for applied voltages of 0–5V is shown. The X-axis represents the applied voltage and the Y-axis represents leakage current density. As shown, the leakage current C according to the invention is smaller than A or B. Accordingly, the above experimental results show methods of forming a microelectronic capacitor including a tantalum pentoxide layer according to the present invention can produce lower leakage current without adversely impacting capacitance values.

As already described, since the dielectric film is formed by performing at least two tantalum pentoxide depositions and UV-$O_3$ annealings, oxygen is supplied into the dielectric film through the thickness thereof so that leakage current can be reduced relative to a dielectric film which is performed with a single layer of tantalum pentoxide, or with only one UV-$O_3$ process after tantalum pentoxide deposition.

As shown, microelectronic capacitors according to the present invention include a first conductive electrode and a second conductive electrode on a microelectronic substrate with a tantalum pentoxide layer therebetween. The tantalum pentoxide layer has a thickness which exceeds 45 Å, and which preferably exceeds 85 Å and which has filled oxygen vacancies across the thickness thereof. The tantalum pentoxide layer preferably comprises a plurality of ozone-ultraviolet annealed tantalum pentoxide thin films, each of which includes filled oxygen vacancies.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating a microelectronic capacitor comprising the steps of:

forming a first tantalum pentoxide film on a conductive electrode on a microelectronic substrate;

annealing the first tantalum pentoxide film in the presence of ultraviolet radiation and ozone; and repeating said forming step and said annealing step at least once to form at least a second tantalum pentoxide film which has been annealed in the presence of ultraviolet radiation, on the first tantalum pentoxide film.

2. A method according to claim 1 wherein said annealing step is performed at temperatures of between about 200° C. and about 400° C.

3. A method according to claim 2 wherein said annealing step is performed for times which are between about 1 minute and about 60 minutes.

4. A method according to claim 1 wherein said repeating step is performed to form a tantalum pentoxide layer of total thickness between about 10 Å and about 500 Å.

5. A method according to claim 1 wherein said repeating step is performed to form a tantalum pentoxide layer of total thickness of at least 85 Å.

6. A method according to claim 1 wherein said repeating step is followed by the step of:

annealing in dry oxygen at temperatures of between about 600° C. and about 800° C. and for a time of between about 10 minutes and about 60 minutes.

7. A method according to claim 1 wherein said repeating step is followed by the step of:

forming a second conductive electrode on the at least a second tantalum pentoxide film.

8. A method according to claim 6 wherein said step of annealing in dry oxygen is followed by the step of:

forming a second conductive electrode on the at least a second tantalum pentoxide film.

9. A method of manufacturing a tantalum pentoxide layer comprising the steps of:

forming a first tantalum pentoxide film;

annealing the first tantalum pentoxide film in the presence of ultraviolet radiation and ozone; and repeating said forming step and said annealing step at least once to form at least a second tantalum pentoxide film which has been annealed in the presence of ultraviolet radiation, on the first tantalum pentoxide film.

10. A method according to claim 9 wherein said annealing step is performed at temperatures of between about 200° C. and about 400° C.

11. A method according to claim 9 wherein said annealing step is performed for times which are between about 1 minute and about 60 minutes.

12. A method according to claim 9 wherein said repeating step is performed to form a tantalum pentoxide layer of total thickness between about 10 Å and about 500 Å.

13. A method according to claim 9 wherein said repeating step is performed to form a tantalum pentoxide layer of total thickness of at least 85 Å.

14. A method according to claim 9 wherein said repeating step is followed by the step of:

annealing in dry oxygen at temperatures of between about 600° C. and about 800° C. and for a time of between about 10 minutes and about 60 minutes.

* * * * *